(12) United States Patent
Oikawa

(10) Patent No.: US 11,437,341 B2
(45) Date of Patent: Sep. 6, 2022

(54) SEMICONDUCTOR DEVICE

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/108,325

(22) Filed: Dec. 1, 2020

(65) Prior Publication Data
US 2021/0233886 A1    Jul. 29, 2021

(30) Foreign Application Priority Data

Jan. 27, 2020  (JP) .............................. JP2020-11001

(51) Int. Cl.
*H01L 23/00*  (2006.01)

(52) U.S. Cl.
CPC ...... *H01L 24/45* (2013.01); *H01L 2924/1205* (2013.01); *H01L 2924/1431* (2013.01); *H01L 2924/14361* (2013.01)

(58) Field of Classification Search
CPC .......... G11C 5/063; G11C 5/025; H01L 25/16
See application file for complete search history.

(56) References Cited

U.S. PATENT DOCUMENTS

| 8,526,267 B2 | 9/2013 | Suwa et al. |
| 9,704,559 B2 | 7/2017 | Hayashi et al. |
| 2007/0035002 A1* | 2/2007 | Moto ...................... H01L 24/49 257/E21.705 |

FOREIGN PATENT DOCUMENTS

| JP | 2012-008920 A | 1/2012 |
| JP | 2015-035159 A | 2/2015 |

* cited by examiner

*Primary Examiner* — Walter H Swanson
(74) *Attorney, Agent, or Firm* — McDermott Will & Emery LLP

(57) ABSTRACT

A semiconductor device comprises two memory chips, one control chip controlling each memory chip, a signal transmission path through which a signal transmission between the control chip and each memory chip is performed, and a capacitance coupled onto the signal transmission path. Also, the capacitance (capacitor element) is larger than each parasitic capacitance parasitic on each chip. Accordingly, it is possible to perform the signal transmission of the semiconductor device at high speed.

6 Claims, 18 Drawing Sheets

FIG. 13

| | Capacitor Element CT | Topology | Input/Output Circuit IO1 | Input/Output Circuit IO2 | Termination Resistor TR1 | Termination Resistor TR2 |
|---|---|---|---|---|---|---|
| EMBODIMENT 1 | EXISTENCE | T-branch | ACTIVE | INACTIVE | ON | OFF |
| MODIFIED EXAMPLE OF EMBODIMENT 1 | EXISTENCE | T-branch | ACTIVE | INACTIVE | OFF | ON |

*FIG. 17*

| | Capacitor Element CT | Topology | Input/Output Circuit IO1 | Input/Output Circuit IO2 | Termination Resistor TR1 | Termination Resistor TR2 |
|---|---|---|---|---|---|---|
| EMBODIMENT 1 | EXISTENCE | T-branch | ACTIVE | INACTIVE | ON | OFF |
| MODIFIED EXAMPLE OF EMBODIMENT 1 | EXISTENCE | T-branch | ACTIVE | INACTIVE | OFF | ON |
| EMBODIMENT 2 | EXISTENCE | Fly-by | ACTIVE /INACTIVE | INACTIVE /ACTIVE | OFF | ON |

SEMICONDUCTOR DEVICE

CROSS-REFERENCE TO RELATED APPLICATIONS

The disclosure of Japanese Patent Application No. 2020-11001 filed on Jan. 27, 2020 including the specification, drawings and abstract is incorporated herein by reference in its entirety.

BACKGROUND

The present invention relates to a semiconductor device (or also referred to as an "electronic device") in which a plurality of semiconductor components is electrically connected with one semiconductor component. For example, it is suitably applicable to a semiconductor device (or an electronic device) in which two memory chips are controlled by one control chip.

There are disclosed techniques listed below.
[Patent Document 1] Japanese Unexamined Patent Application Publication No. 2015-35159
[Patent Document 2] Japanese Unexamined Patent Application Publication No. 2012-8920

There is a semiconductor device in which a plurality of memory chips and a control chip for controlling each of the plurality of memory chips are electrically connected with each other in T-branch structure (T-branch topology) (for example, see FIG. 10 of Patent Document 1). Also, there is a semiconductor device in which the above memory chips and the above control chip are electrically connected with each other in Fly-by topology (for example, see FIGS. 7 to 9 of Patent Document 1). Furthermore, there is a semiconductor device in which a termination resistor is disposed, for example, at an end of a signal transmission path in which a data signal is to be transmitted.

SUMMARY

In case of a configuration in which two memory chips each serving as a load are controlled by one control chip (hereinafter referred to as "branch case"), such as a semiconductor device employing "T-branch topology" or a semiconductor device employing "Fly-by topology", the drive capability of the control chip controlling the memory chip is insufficient as compared with a configuration in which one memory chip is controlled by one control chip (hereinafter referred to as "reference case"). Therefore, by the study of the present inventor, it is found that there is a possibility in "branch case" that a signal cannot be transmitted due to: 1) the configuration of a signal transmission path through which a signal transmission between a control chip and each memory chip is performed; and 2) the transmission speed (i.e., data rate) of a signal to be transmitted on the signal transmission path.

Other objects and novel features will become apparent from the description of this specification and the accompanying drawings.

The typical ones of the embodiments disclosed in the present application will be briefly described as follows.

A semiconductor device according to one embodiment, comprises: a first memory chip; a second memory chip; a control chip controlling each memory chip; and a first signal transmission path through which a signal transmission between said control chip and each memory chip is performed. Also, a signal transmission between said control chip and said first memory chip is performed via said first signal transmission path. On the other hand, a signal transmission between said control chip and said second memory chip is performed via a part of said first signal transmission path and a second signal transmission path branched from said first signal transmission path at a first branch point of said first signal transmission path, which is located between said control chip and said first memory chip. Furthermore, a capacitance that is larger than each parasitic capacitance parasitic on each chip is coupled onto a third signal transmission path branched from said first signal transmission path at a second branch point of said first signal transmission path, which is located between said control chip and said first branch point of said first signal transmission path.

Also, a semiconductor device according to another embodiment, comprises: a wiring substrate; a memory device mounted on said wiring substrate; a control chip mounted on said wiring substrate; and a capacitor element mounted on said wiring substrate. Here, said wiring substrate includes a first wiring that is a transmission path for a signal. Also, said memory device comprises: an interposer; a first memory chip mounted on said interposer; a second memory chip mounted on said interposer; a first conductive material electrically connected to a first electrode pad of said first memory chip; a second conductive material electrically connected to a second electrode pad of said second memory chip; and an external connection terminal electrically connected with each of a first input/output circuit of said first memory chip and a second input/output circuit of said second memory chip. Also, said control chip controls each memory chip. Also, said capacitor element includes a first electrode electrically connected with said first wiring of said wiring substrate. Also, said first wiring has: a first terminal electrically connected with an external connection terminal of said control chip; and a second terminal electrically connected with said external connection terminal of said memory device. Also, said first input/output circuit of said first memory chip is electrically connected with said control chip via said first electrode pad of said first memory chip, said first conductive material, said external connection terminal of said memory device, and said first wiring of said wiring substrate. Also, said second input/output circuit of said second memory chip is electrically connected with said control chip via said second electrode pad of said second memory chip, said second conductive material, said external connection terminal of said memory device, and said first wiring of said wiring substrate. Also, said first electrode of said capacitor element is coupled to a path of said first wiring, which is located between said first terminal and said second terminal. Furthermore, a capacitance of said capacitor element is larger than each parasitic capacitance parasitic on each chip.

Further, a semiconductor device according to another embodiment, comprises: a wiring substrate; a first memory device mounted on said wiring substrate; a second memory device mounted on said wiring substrate; a control chip mounted on said wiring substrate; and a capacitor element mounted on said wiring substrate. Here, said wiring substrate includes a first wiring that is a transmission path for a signal. Also, said first memory device comprises: a first interposer; a first memory chip mounted on said first interposer; a first conductive material electrically connected to a first electrode pad of said first memory chip; and a first external connection terminal electrically connected with a first input/output circuit of said first memory chip. Also, said second memory device comprises: a second interposer; a second memory chip mounted on said second interposer; a second conductive material electrically connected to a second electrode pad of said second memory chip; and a second external connection terminal electrically connected with a second input/output circuit of said second memory chip. Also, said control chip controls each memory chip. Also, said capacitor element includes a first electrode electrically connected with said first wiring of said wiring substrate. Also, said first wiring has: a first terminal electrically connected with an external connection terminal of said control chip; a second terminal electrically connected with said first external connection terminal of said first memory device; and a third terminal electrically connected with said second external connection terminal of said second memory device. Also, said first input/output circuit of said first memory chip is electrically connected with said control chip via said first electrode pad of said first memory chip, said first conductive material, said first external connection terminal of said first memory device, and said first wiring of said wiring substrate. Also, said second input/output circuit of said second memory chip is electrically connected with said control chip via said second electrode pad of said second memory chip, said second conductive material, said second external connection terminal of said second memory device, a part of said first wiring of said wiring substrate, and a second wiring of said wiring substrate. Here, said second wiring is a wiring branched from said first wiring at a first branch point of said first wiring, which is located between said first terminal and said second terminal. Also, said first electrode of said capacitor element is coupled to a path of said first wiring, which is located among said first terminal, said second terminal and said third terminal. Furthermore, a capacitance of said capacitor element is larger than each parasitic capacitance parasitic on each chip.

According to said semiconductor device in one embodiment, it is possible to provide a semiconductor device capable of transmitting a signal at high speed.

Also, according to said semiconductor device in another embodiment, it is possible to provide a semiconductor device capable of transmitting a signal at high speed.

Furthermore, according to said semiconductor device in another embodiment, it is possible to provide a semiconductor device capable of transmitting a signal at high speed.

BRIEF DESCRIPTION OF THE DRAWINGS

FIG. 13 is a diagram illustrating an example of use of each input/output circuit, each termination resistor, and the like, in which EMBODIMENT 1 and MODIFIED EXAMPLE of EMBODIMENT 1 are compared with each other.

FIG. 17 is a diagram illustrating an example of use of each input/output circuit, each termination resistor, and the like, in which EMBODIMENT 2 and each of EMBODIMENT 1 and MODIFIED EXAMPLE of EMBODIMENT 1 are compared with each other.

DETAILED DESCRIPTION

Examined Example

First, prior to explaining DETAILED DESCRIPTION, the configuration of a semiconductor device studied by the present inventor and the problems clarified by the examination by the present inventor will be explained in detail.

<Semiconductor Device SDR1$r$ of Examined Example>

Figure 1:
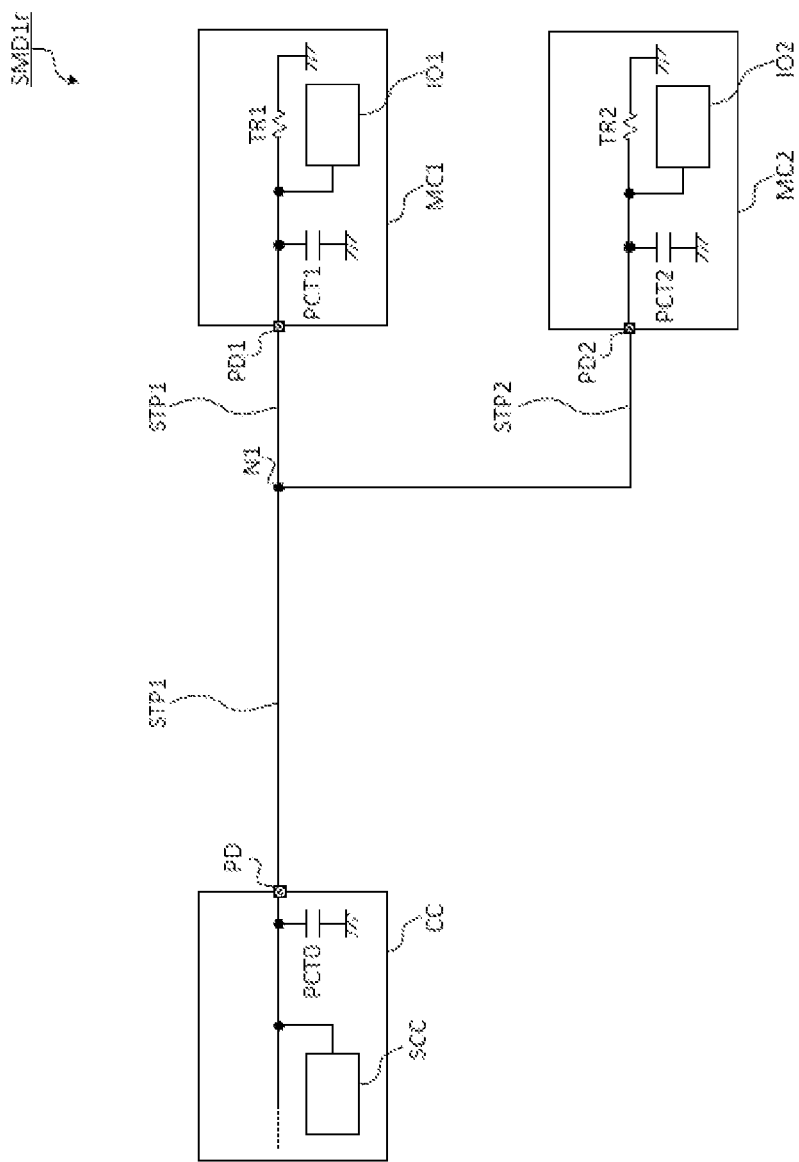
FIG. 1 is a diagram (circuit diagram) illustrating a configuration of a semiconductor device studied by the present inventor.

FIG. 1 is a diagram (circuit diagram) illustrating the configuration of a semiconductor device SMD1$r$ studied by the present inventor. As shown in FIG. 1, the semiconductor device SMD1$r$ includes two memory chips MC1, MC2 and a control chip CC controlling the two memory chips MC1, MC2.

Each memory chip MC1, MC2, as shown in FIG. 1, and an electrode pad PD1, PD2, an input-output circuit IO1, IO2 electrically connected to the electrode pad PD1, PD2, and a termination resistor TR1, TR2 electrically connected to the electrode pad PD1, PD2. Incidentally, as shown in FIG. 1, one end portion of each termination resistor TR1, TR2 is electrically connected to each electrode pad PD1, PD2 of each memory chip MC1, MC2, the other end portion opposite to the one end portion is connected to the reference potential (i.e., "R=∞"). As shown in FIG. 1, a parasitic capacitance PCT1, PCT2 of about 0.8 pF, for example, is parasitic on the respective electrode pads PD1, PD2. In other words, each parasitic capacitance PCT1, PCT2 is connected to each of the signal transmission paths STP1, STP2 to which each of the input/output circuits IO1, IO2 is connected. Further, the two memory chips MC1, MC2 are of the same type to each other, for example, a LPDDR5-SDRAM (Low Power Double Data Rate 5-Synchronous Dynamic Random Access Memory that conforms to JEDEC standard).

On the other hand, the control chip CC, as shown in FIG. 1, has an electrode pad PD, and a control circuit SCC electrically connected to the electrode pad PD. Like the memory chips MC1, MC2, as shown in FIG. 1, the electrode pad PD has a parasitic capacitance PCT0 of, for example, about 0.8 pF parasitic on the electrode pad PD. In other words, the parasitic capacitance PCT0 is connected to the signal transmission path STP1 to which the control circuit SCC is connected.

As described above, the semiconductor device SMD1r includes the signal transmission path STP1, STP2, and the signal transmission between the control chip CC and the memory chips MC1, MC2 is performed via the signal transmission path STP1, STP2. Specifically, the signal transmission between the control chip CC and the first memory chip MC1 is performed via the signal transmission path STP1 as shown in FIG. 1. On the other hand, as shown in FIG. 1, signal transmission between the control chip CC and the second memory chip MC2 is performed via a part of the signal transmission path STP1 and the signal transmission path STP2 branched from the signal transmission path STP1 at the branch point N1 of the signal transmission path STP1 located between the control chip CC and the first memory chip MC1. The signal transmission path STP1 from the branch point N1 to the first memory chip MC1 is a main path for the first memory chip MC1. Similarly, the signal transmission path STP2 from the branch point N1 to the second memory chip MC2 is a main path for the second memory chip MC2. However, in the present examined example (including the basic idea described later), the signal transmission path STP2 from the branch point N1 to the second memory chip MC2 is described as a path (branch line) branched from the signal transmission path STP1 connecting the control chip CC and the first memory chip MC1.

Further, the distance of the signal transmission path STP1 from the branch point N1 to the electrode pad PD1 of the memory chip MC1 and the distance of the signal transmission path STP2 from the branch point N1 to the electrode pad PD2 of the memory chip MC2 are substantially the same as each other. That is, the connection form between the first control chip CC and each memory chip MC1, MC2 employs a so-called "T-branch topology". It should be noted that "substantially the same" herein means that the products are not necessarily the same as each other due to manufacturing variations in the products actually manufactured, although they are the same in design. In addition, a so-called fly-by topology in which the above-mentioned distances differ from each other may be adopted as a connecting mode of the control chip CC and each memory chip MC1, MC2.

Next, the signal-transmission operation of the semiconductor device SMD1r described above will be described.

For example, when accessing the first memory chip MC1, the input/output circuit IO1 of the first memory chip MC1 is activated, while the input/output circuit IO2 of the second memory chip MC2 is deactivated. When accessing the first memory chip MC1, the resistance value (R) of the termination resistor TR1 is decreased in order to turn on this termination resistor TR1 of the first memory chip MC1 to be accessed (i.e., to bring it closer to a state in which the termination resistor TR1 exists), while the resistance value (R) of the termination resistor TR2 is increased in order to turn off this termination resistor TR2 of the second memory chip MC2 not to be accessed (i.e., to bring it closer to a state in which the termination resistor TR2 does not exist). The term "access" as used herein refers to, for example, an operation for writing data to a memory chip (write operation), an operation for reading data stored in a memory chip (read operation), or an operation for erasing data stored in a memory chip (erase operation). In addition, the control circuits SCC of the control chip CC execute the above-mentioned controls such as "active state", "inactive state", "on" and "off" on the basis of signals (hereinafter referred to as "exciting signals") transmitted from the control circuits SCC of the control chip CC via the electrode pads PD of the control chip CC, the signal transmission paths STP1, STP2, and the electrode pads PD1, PD2 of the memory chips MC1, MCR2. In addition, the input/output circuits IO1, IO2 of each memory chip MC1, MC2 are activated by charging each parasitic capacitance PCT1, PCT2 parasitic on each memory chip MC1, MC2, and are deactivated by discharging each parasitic capacitance PCT1, PCT2 parasitic on each memory chip MC1, MC2. Further, in the present examined example, although the timing of switching the values of the respective termination resistors TR1, TR2 is performed after switching the states of the respective input/output circuits IO1, IO2, the timing of switching the values of the respective termination resistors TR1, TR2 may be the same as the timing of switching the states of the respective input/output circuits IO1, IO2.

Details of Problems Found by Examination

Next, the details of the problems that have been clarified by the examination of the present inventor will be described.

First, as described above, the semiconductor device SDR1r examined by the present inventor is a configuration in which two memory chips MC1, MC2 are controlled by one control chip CC (branch case). That is, in the semiconductor device SDR1r studied by the present inventors, for one control chip CC, two loads (input-output circuit of the memory chip) are connected. Therefore, the drive capability of the control chip CC is insufficient as compared with a configuration in which one load is connected to one control chip CC.

Figure 2:
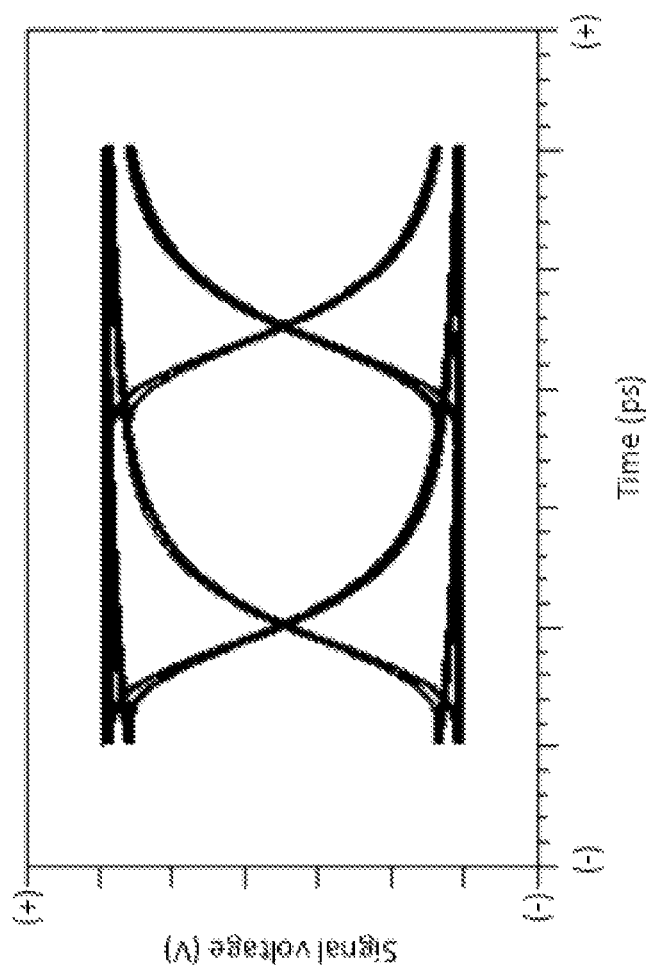
FIG. 2 is a diagram showing an eye pattern of the reference case studied by the present inventor.
Figure 3:
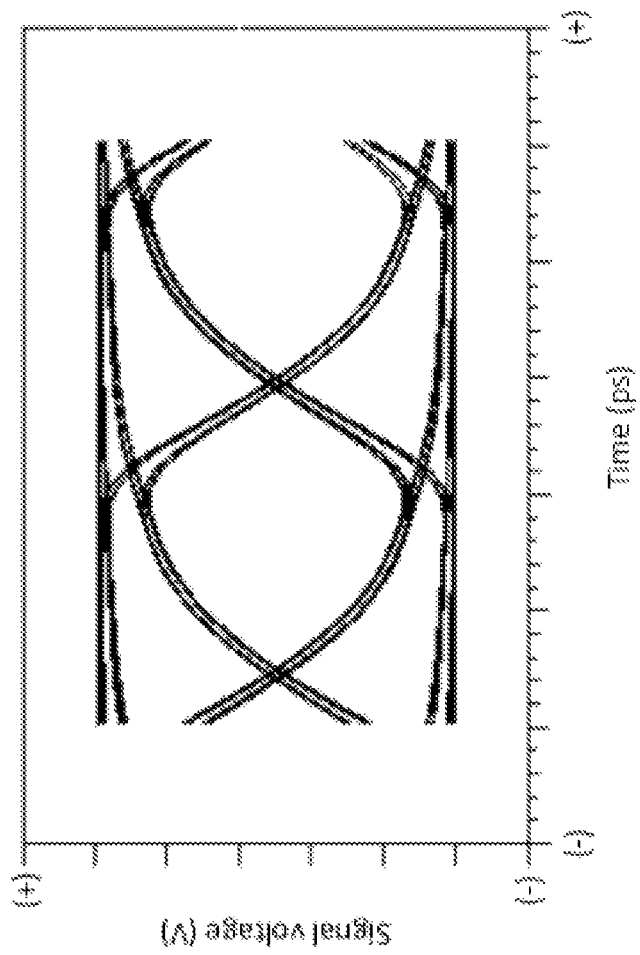
FIG. 3 is a diagram showing an eye pattern of the branch case 1 studied by the present inventor.
Figure 4:
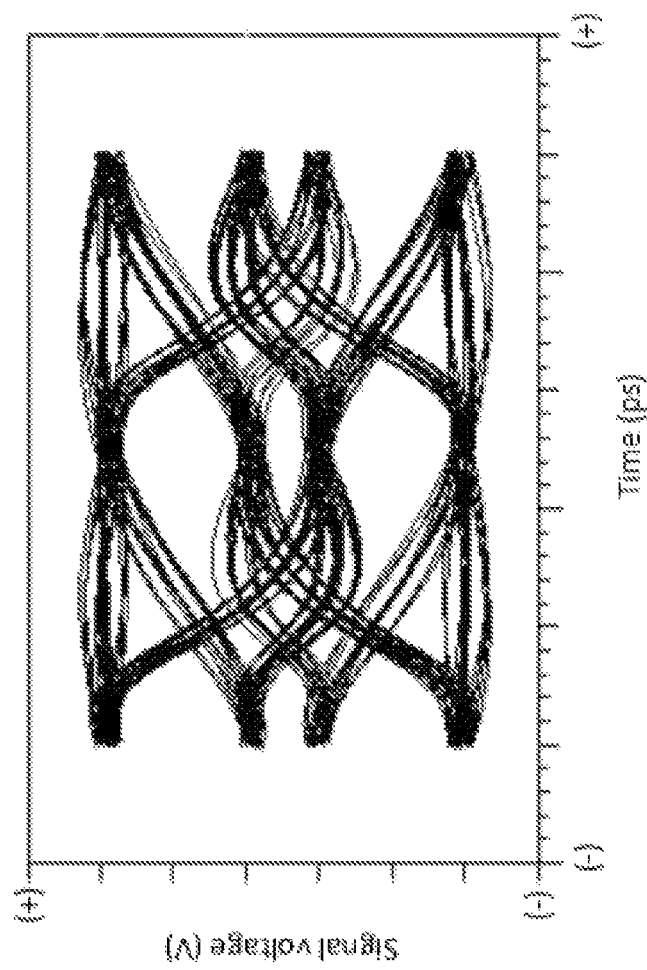
FIG. 4 is a diagram showing an eye pattern of the branch case 2 studied by the present inventor.

Next, the present inventor confirmed the eye pattern of the branch case (branch case 1) in which the total length of the signal transmission path from the branch point N1 to each of the memory chips MC1, MCR2 (strictly, the signal transmission path from the branch point N1 to each of the input/output circuits IO1, IO2) is, for example, 1.0 mm (=0.5 mm×2), and the eye pattern of the branch case (branch case 2) in which the total length of the signal transmission path is, for example, 12.0 mm (=6.0 mm×2), together with the eye pattern of the reference case. As a result, as shown in FIGS. 2 to 4, it was found that the eye pattern of each branch case in which the driving capability of the control chip was insufficient is more easily disturbed than the eye pattern of the reference case, and that the disturbance of the eye pattern becomes remarkable when the length of the signal transmission path from the branch point N1 to each memory chip MC1, MCR2 (i.e., the sum length of the signal transmission paths) is a certain length. Incidentally, the "eye pattern" is a waveform diagram graphically shown by superimposing transitions of a plurality of signal waveforms, as shown in FIGS. 2 to 4. Further, when the eye pattern is disturbed, whether the signal voltage has exceeded the desired voltage value (i.e., rising), or whether the signal voltage has fallen below the desired voltage value (i.e., falling), it is difficult to recognize accurately.

Furthermore, it was clarified by the examination of the present inventors that the above-described eye pattern disturbance becomes remarkable as the transmission speed (data rate) of the signal to be transmitted from the control chip CC toward the respective memory chip MC1, MC2 becomes faster. The reason for this will be described later.

Next, the cause (mechanism) of disturbance of the eye pattern will be described with reference to FIGS. 5 to 6.

Figure 5:
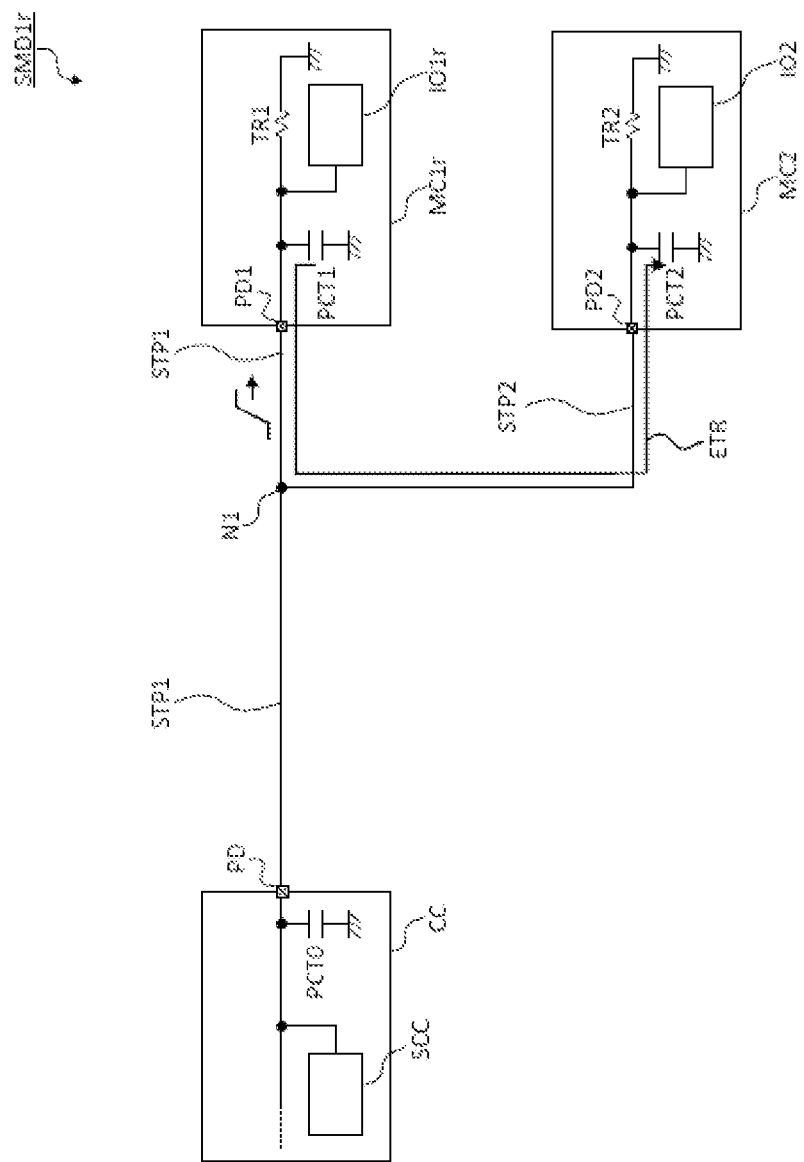
FIG. 5 is a diagram illustrating a charge exchange occurred when a signal voltage rises, in said branch case 2.

FIG. 5 is a diagram illustrating a charge exchange occurred when the signal voltage rises, in the branch case 2 described above. More specifically, for example, when accessing one memory chip MC1, first, exciting signals (not shown) are supplied from the control chip CC to the respective memory chips MC1, MC2, the input/output circuits IO1 of the memory chips MC1 (referred to as "active elements") to be accessed are activated, and the input/output circuits IO2 of the memory chips MC2 (referred to as "inactive elements") not to be accessed are deactivated. Here, the parasitic capacitance PCT1 parasitic on the memory chip MC1 to be accessed is charged based on the exciting signals supplied from the control chip CC, whereby the input/output circuits IO1 of the memory chip MC1 are activated. On the other hand, the parasitic capacitance PCT2 parasitic on the memory chip MC2 which is not accessed is discharged based on the above-mentioned exciting signals, and the input/output circuits IO2 of the memory chip MC2 are inactivated.

However, when the above-mentioned exciting signals are supplied to each memory chip MC1, MC2, the two memory chips MC1, MC2 resonate with each other, and as a result, charges are exchanged between two parasitic capacitances PCT1, PCT2 parasitic on the two memory chips MC1, MC2. As shown in FIG. 5, the electric charge ETR stored in the parasitic capacitance PCT1 parasitic on the memory chip MC1 which is the active element moves to the parasitic capacitance PCT2 parasitic on the memory chip MC2 which is the inactive element, and as a result, the parasitic capacitance of the active element is not immediately charged.

Figure 6:
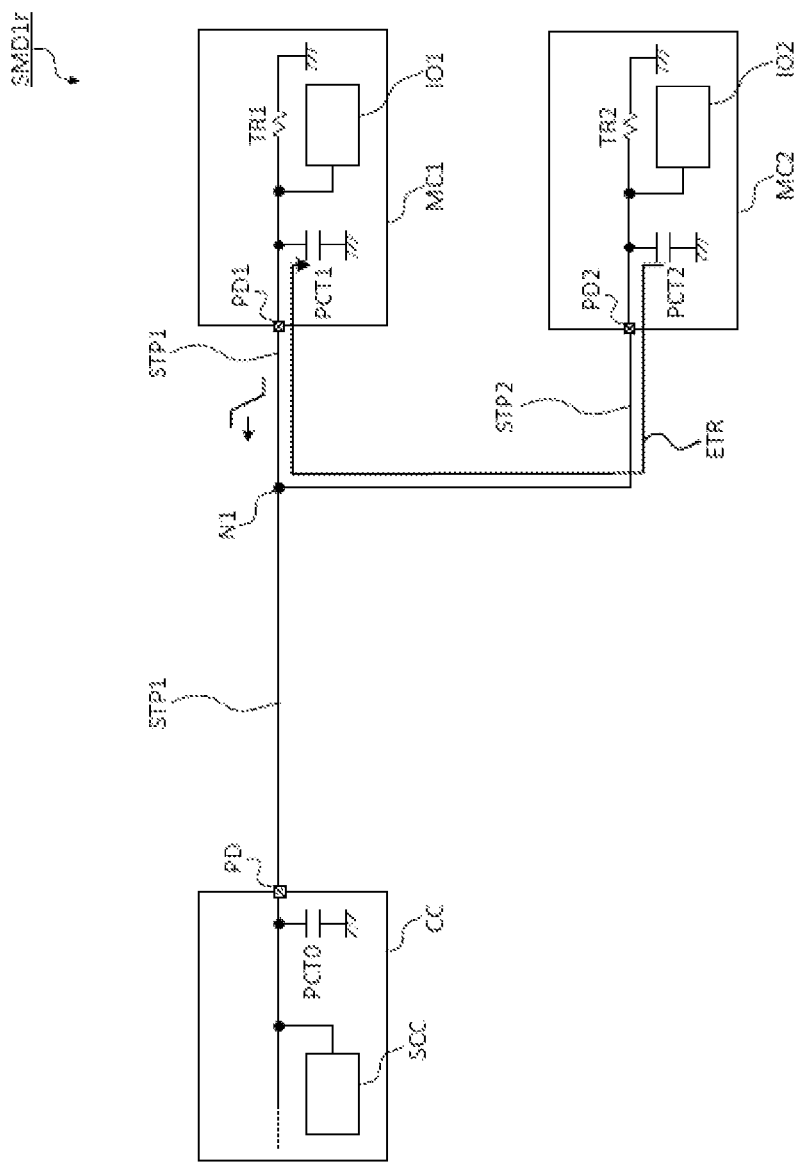
FIG. 6 is a diagram illustrating a charge exchange occurred when a signal voltage falls, in said branch case 2.

FIG. 6 is a diagram illustrating a charge exchange occurred when the signal voltage falls, in the branch case 2 described above. More specifically, for example, when accessing one memory chip MC1, first, exciting signals (not shown) are supplied from the control chip CC to each memory chip MC1, MC2 to deactivate each input/output circuit IO1, IO2 of each memory chip MC1, MC2. Here, the parasitic capacitance PCT1 parasitic on the memory chip MC1 ("active device") to be accessed is discharged based on the exciting signals supplied from the control chip CC, whereby the input/output circuits IO1 of the memory chip MC1 are deactivated. Similarly, the parasitic capacitance PCT2 parasitic on the memory chip MC2 ("inactive device") which is not accessed is discharged on the basis of the above-mentioned exciting signals, and the input/output circuits IO2 of the memory chip MC2 become inactive.

However, when the above-mentioned exciting signals are supplied to each memory chip MC1, MC2, the two memory chips MC1, MC2 resonate with each other, and as a result, charges are exchanged between two parasitic capacitances PCT1, PCT2 parasitic on the two memory chips MC1, MC2. As shown in FIG. 6, although the parasitic capacitance PCT1 parasitic on the memory chip MC1 which is the active element starts to be discharged, the charge ETR accumulated in the parasitic capacitance PCT2 parasitic on the memory chip MC2 which is the inactive element moves to the parasitic capacitance PCT1 of the active element, and as a result, the parasitic capacitance of the active element is not discharged immediately.

Note that the cycle of the above-described charge-exchange changes in accordance with the sum length of the signal transmission paths from the branch point N1 to the memory chips MC1, MCR2.

On the other hand, the excitation signal supplied (transmission) from the control chip to the active element has a certain period. Here, the transmission speed (data rate) of the signal is faster, i.e., the higher the frequency of the signal, the more frequencies it contains. For example, a signal with 8 Gbps data transfer rate contains a number of spectrums, such as 4 GHz, 2 GHz, 1 GHz, and vicinity-current spectrum. That is, increasing the data rate in the branch case described above in order to perform high-speed access to the memory chip means that the period of charge exchange and the period of the signal are higher probability of coincidence with each other.

Then, it has been clarified by the study of the present inventor that the 2 types of cycles described above coincide with each other is a cause of causing the above-described disturbance of the eye pattern. Incidentally, as shown in FIGS. 3 to 4, as the total length of the signal transmission paths from the branch point N1 to the respective memory chip MC1, MCR2 becomes longer, the period of the charge exchange approaches the period of the signal (i.e., becomes easier to match) also became clear by further examination of the present inventors.

If the eye pattern is disturbed, the parasitic capacitance PCT1, PCT2 parasitic on each memory chip MC1, MC2 is prevented from being sufficiently charged and discharged, and as a result, signals may not be transmitted between the control chip CC and each memory chip MC1, MC2.

Means (Basic Idea) for Solving Problems

Next, a means (basic idea) found by the inventor of the present invention and that is capable of suppressing disturbance of an eye pattern will be described.

Figure 7:
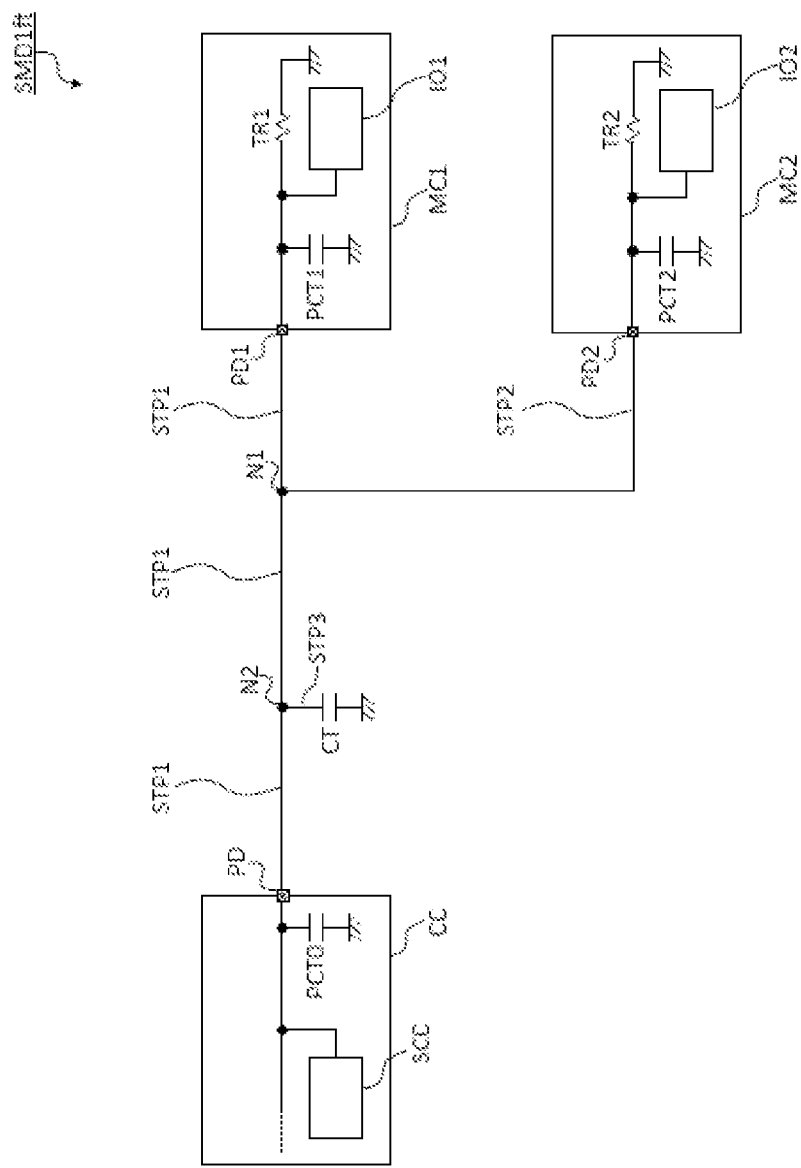
FIG. 7 is a diagram (circuit diagram) illustrating a configuration of a semiconductor device found by the present inventor.

FIG. 7 is a diagram (circuit diagram) illustrating the configuration of a semiconductor device SMD1$f\!t$ found by the present inventor. As shown in FIG. 7, like the semiconductor device SMD1$r$, the semiconductor device SMD1$f\!t$ mainly includes two memory chips MC1, MC2 and a control chip CC controlling the two memory chips MC1, MC2. As a difference from the semiconductor device SMD1$r$ studied by the present inventor, the semiconductor device SMD1$f\!t$ found by the present inventor further has a new capacitance CT between the control chip CC and the branch point N1 of the signal transmission path STP1. Specifically, as shown in FIG. 7, the above-described new capacitance CT is coupled onto (provided on) the signal transmission path STP3 branched from the signal transmission path STP1 at the branch point N2 of the signal transmission path STP1, which is located between the control chip CC and the branch point N1 of the signal transmission path STP1.

The capacitance CT coupled onto the signal transmission path STP3 is larger than each of the parasitic capacitance PCT0 parasitic on the control chip CC, the parasitic capacitance PCT1 parasitic on the first memory chip MC1, and the parasitic capacitance PCT2 parasitic on the second memory chip MC2. Specifically, the capacitance CT is larger than 1.0 times one of the parasitic capacitance PCT0 parasitic on the control chip CC, the parasitic capacitance PCT1 parasitic on the first memory chip MC1, and the parasitic capacitance PCT2 parasitic on the second memory chip MC2, and less than or equal to 2.0 times one of the parasitic capacitance PCT0 parasitic on the control chip CC, the parasitic capacitance PCT1 parasitic on the first memory chip MC1, and the parasitic capacitance PCT2 parasitic on the second memory chip MC2. That is, the capacitance CT is a value satisfying the relational expression "0.8 pF<capacitance CT 1.6 pF". The reason for this will be described later.

Effect of Basic Idea

Next, the effect of SMD1$f\!t$ of the semiconductor device found by the inventor of the present invention will be described with reference to FIGS. 8 to 9.

Figure 8:
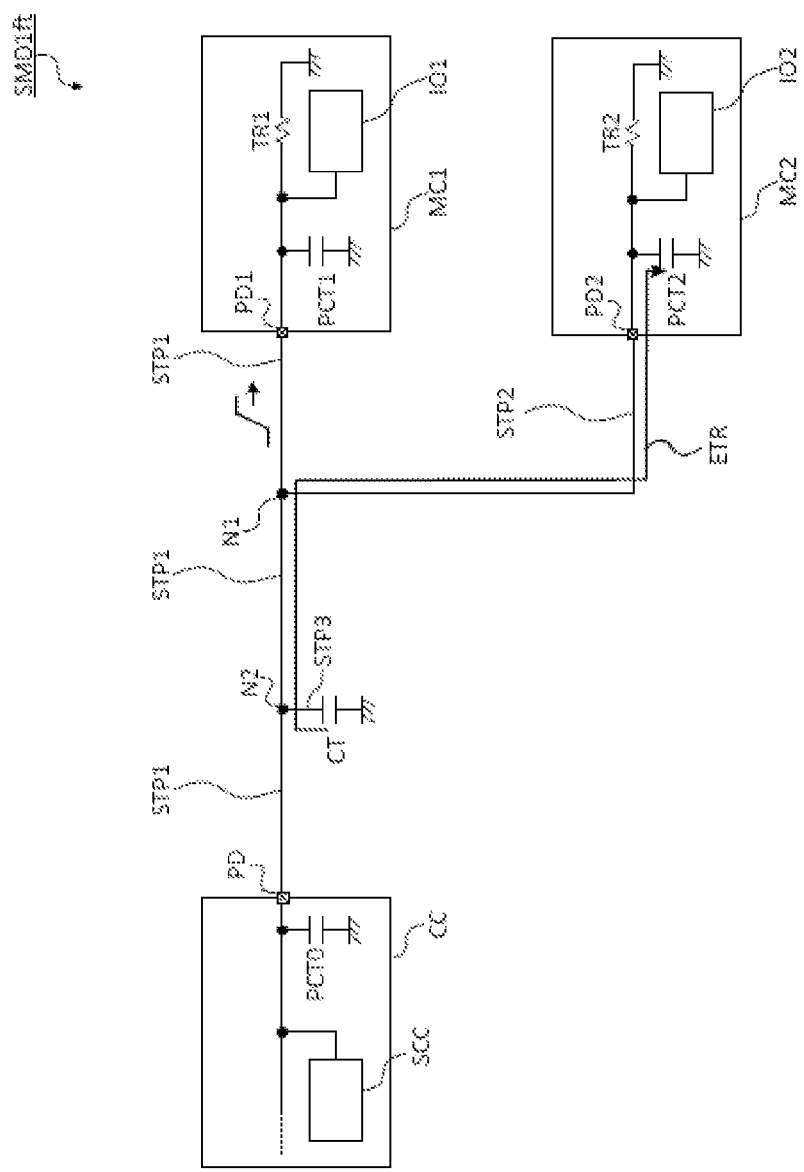
FIG. 8 is a diagram illustrating a charge exchange occurred when a signal voltage rises, in said branch case 2.

FIG. 8 is a diagram illustrating a charge exchange occurred when the signal voltage rises, in the branch case 2 described above. More specifically, for example, when accessing one memory chip MC1, first, the control chip CC supplies exciting signals (not shown) to the memory chips MC1, MC2, the input/output circuit IO1 of the memory chip MC1 ("active element") to be accessed is activated, and the input/output circuit IO2 of the memory chip MC2 ("inactive element") not to be accessed is deactivated. Here, the parasitic capacitance PCT1 parasitic on the memory chip MC1 to be accessed is charged based on the exciting signals supplied from the control chip CC, whereby the input/output circuits IO1 of the memory chip MC1 are activated. On the other hand, the parasitic capacitance PCT2 parasitic on the memory chip MC2 which is not accessed is discharged based on the above-mentioned exciting signals, and the input/output circuits IO2 of the memory chip MC2 are inactivated.

Here, the semiconductor device SMD1r examined by the present inventor does not have a capacitance CT larger than the parasitic capacitances PCT1, PCT2, unlike the semiconductor device SMD1ft found by the present inventor. Therefore, when the above-mentioned exciting signals are supplied to the memory chips MC1, MC2, charges are exchanged between the two parasitic capacitances PCT1, PCT2. In contrast, in the semiconductor device SMD1ft we found, in addition to the two parasitic capacitance PCT1, PCT2 described above, it further has a larger capacitance CT than the two parasitic capacitance PCT1, PCT2. Therefore, as shown in FIG. 8, the electric charges ETR accumulated in the capacitance CT move more preferentially to the parasitic capacitance PCT2 parasitic on the memory chip MC2 which is the inactive element than to the parasitic capacitance PCT1 parasitic on the memory chip MC1 which is the active element. That is, the timing of the discharge of the parasitic capacitance parasitic on the active element changes. Thus, the charge ETR stored in the parasitic capacitance of the active element, during charging of the parasitic capacitance of the active element, it becomes difficult to extract the parasitic capacitance parasitic on the inactive element, as a result, the parasitic capacitance of the active element is charged.

Figure 9:
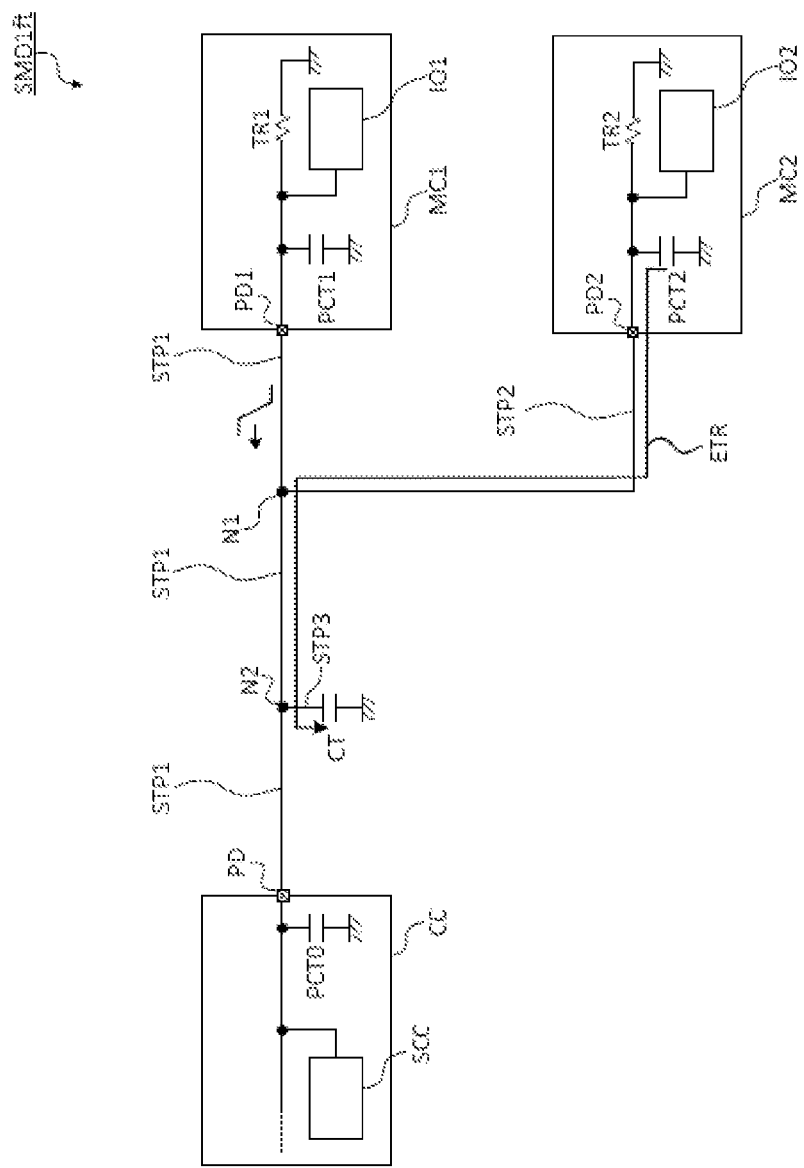
FIG. 9 is a diagram illustrating a charge exchange occurred when a signal voltage falls, in said branch case 2.

FIG. 9 is a diagram illustrating a charge exchange occurred when the signal voltage falls, in the branch case 2 described above. More specifically, for example, when accessing one memory chip MC1, first, exciting signals (not shown) are supplied from the control chip CC to each memory chip MC1, MC2 to deactivate each input/output circuit IO1, IO2 of each memory chip MC1, MC2. Here, the parasitic capacitance PCT1 parasitic on the memory chip MC1 to be accessed is discharged based on the exciting signals supplied from the control chip CC, whereby the input/output circuits IO1 of the memory chip MC1 are deactivated. Similarly, the parasitic capacitance PCT2 parasitic on the memory chip MC2 which is not accessed is discharged on the basis of the above-mentioned exciting signals, and the input/output circuits IO2 of the memory chip MC2 are deactivated.

Here, in the semiconductor device SMD1r examined by the present inventor, unlike the semiconductor device SMD1ft found by the present inventor, the capacitance CT is not larger than each parasitic capacitance PCT1, PCT2, and therefore, when the above-mentioned exciting signals are supplied to each memory chip MC1, MC2, charges are exchanged between the two parasitic capacitances PCT1, PCT2. In contrast, in the semiconductor device SMD1ft we found, in addition to the two parasitic capacitance PCT1, PCT2 described above, it further has a larger capacitance CT than the two parasitic capacitance PCT1, PCT2. Therefore, as shown in FIG. 9, when the parasitic capacitance PCT1 parasitic on the memory chip MC1 as the active element starts to be discharged, the charge ETR stored in the parasitic capacitance PCT2 parasitic on the memory chip MC2 as the inactive element moves preferentially to the capacitance CT larger than the parasitic capacitance PCT1 parasitic on the memory chip MC1. That is, the timing of the charging of the parasitic capacitance parasitic on the active element is changed. This makes it difficult for the electric charge ETR stored in the parasitic capacitance of the inactive element to move to the parasitic capacitance parasitic on the active element at the time of discharging the parasitic capacitance of the active element, and as a result, the parasitic capacitance of the active element is discharged.

When the newly installed capacitance CT is less than or equal to each of the parasitic capacitance PCT0 parasitic on the control chip CC, the parasitic capacitance PCT1 parasitic on the first memory chip MC1, and the parasitic capacitance PCT2 parasitic on the second memory chip MC2, a charge exchange between the capacitance CT and the parasitic capacitance parasitic on the inactive element is not performed preferentially than a charge exchange between the parasitic capacitance parasitic on the inactive element and the parasitic capacitance parasitic on the inactive element. Further, when the newly provided capacitance CT is larger than each of the parasitic capacitance PCT0 parasitic on the control chip CC, the parasitic capacitance PCT1 parasitic on the first memory chip MC1, and the parasitic capacitance PCT2 parasitic on the second memory chip MC2 (i.e., when the capacitance CT satisfies the relational expression of "1.6 pF<capacitance CT"), there is a possibility that the capacitance CT will not be sufficiently charged and discharged. As a result, the capacitance CT (specifically, the electrode of the capacitance CT) is connected, the wiring is a transmission path of the signal (here, the signal transmission path STP1), there is a possibility that the current does not flow.

On the other hand, the semiconductor device SMD1ft found by the present inventor has the capacitance CT that is larger than 1.0 times one of the parasitic capacitance PCT0 parasitic on the control chip CC, the parasitic capacitance PCT1 parasitic on the first memory chip MC1, and the parasitic capacitance PCT2 parasitic on the second memory chip MC2, and less than or equal to 2.0 times one of the parasitic capacitance PCT0 parasitic on the control chip CC, the parasitic capacitance PCT1 parasitic on the first memory chip MC1, and the parasitic capacitance PCT2 parasitic on the second memory chip MC2. Therefore, without disturbing the flow of current, it is possible to realize a sufficient charge and discharge for the parasitic capacitance of the active element.

EMBODIMENT

Next, a specific aspect relating to the above-described basic idea will be described.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The following embodiments will be explained in detail based on the drawings. In all the drawings for explaining the embodiments, members having the same functions are denoted by the same reference numeral and hatches, and repetitive descriptions thereof are omitted. In the following embodiments, descriptions of the same or similar parts will not be repeated in principle except when particularly necessary. In the drawings used in the embodiments, hatching may be omitted even in the case of cross-sectional view in order to make the drawings easier to see. Also, even in the case of a plan view, hatching may be used to make the drawing easier to see.

Embodiment 1

<Configuration of Semiconductor Device SMD1 of Embodiment 1>

Figure 10:
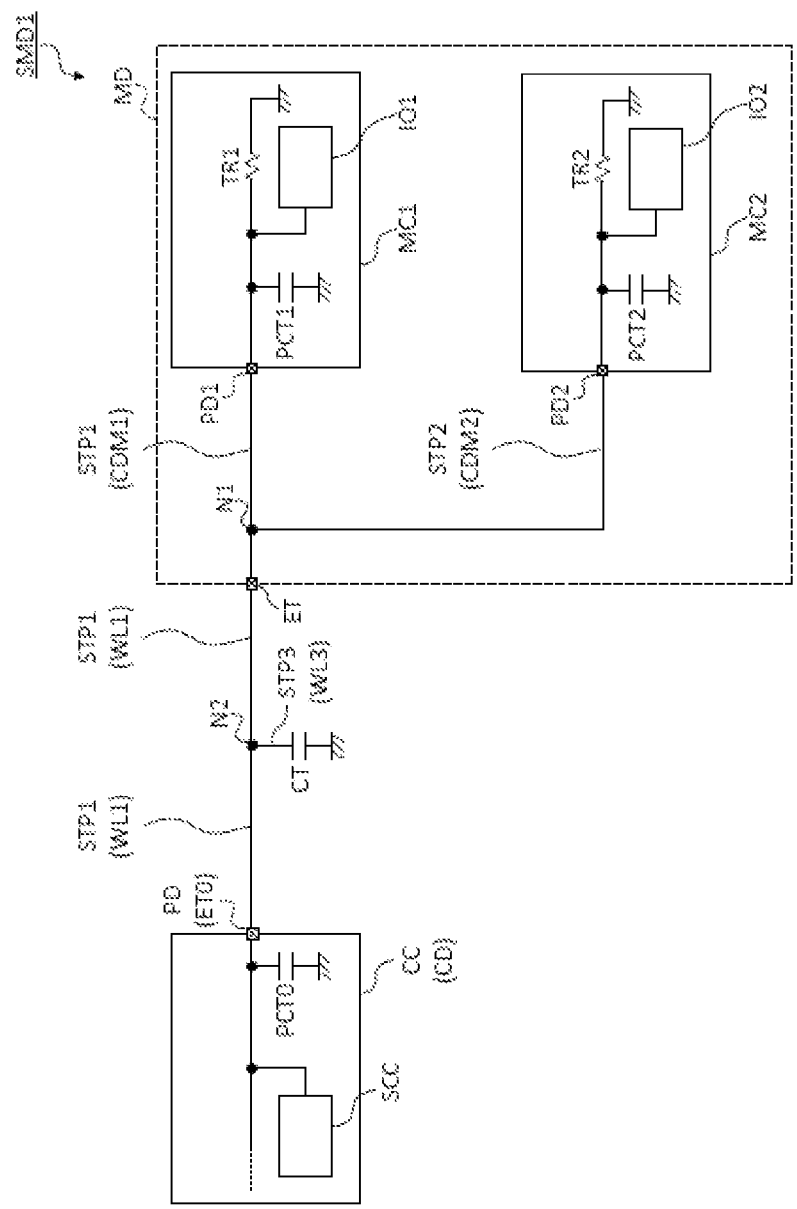
FIG. 10 is a diagram (circuit diagram) illustrating a configuration of a semiconductor device according to EMBODIMENT 1.

FIG. 10 is a diagram (circuit diagram) illustrating the configuration of a semiconductor device SMD1 according to the present embodiment 1. As shown in FIG. 10, the semiconductor device SMD 1 mainly includes two memory chips MC1, MC2, a control chip CC controlling the two memory chips MC1, MC2, and a capacitance CT, similarly to the semiconductor device SMD1r according to the basic idea described above.

In the present embodiment 1, as shown in FIG. 10, the two memory chips MC1, MC2 are configured as one memory device MD. Then, as shown in FIG. 10, the respective electrode pads PD1, PD2 electrically connected to the respective input/output circuits IO1, IO2 of the respective memory chips MC1, MC2 are connected to the external connection terminals ET of the memory device MD common to each other via the respective conductive members CDM1, CDM2 serving as a part of the signal transmission path. That is, as shown in FIG. 10, the branch point N1 is provided in the memory device MD.

Next, the respective members composing the semiconductor device SMD1 will be described in detail with reference to FIGS. 10 to 12.

Figure 11:
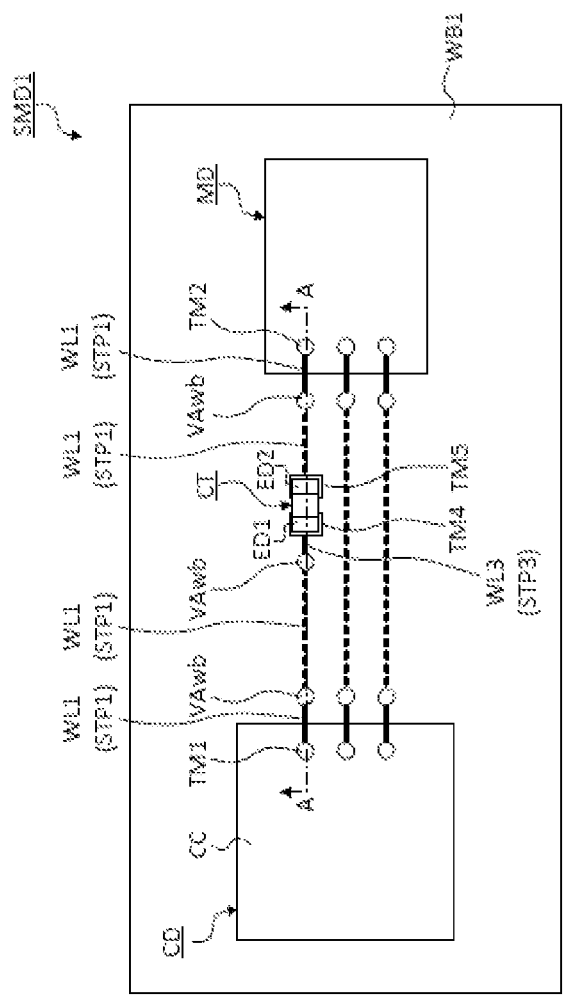
FIG. 11 is a diagram (plan view) schematically illustrating a planar layout of each electronic component composing said semiconductor device according to EMBODIMENT 1.
Figure 12:
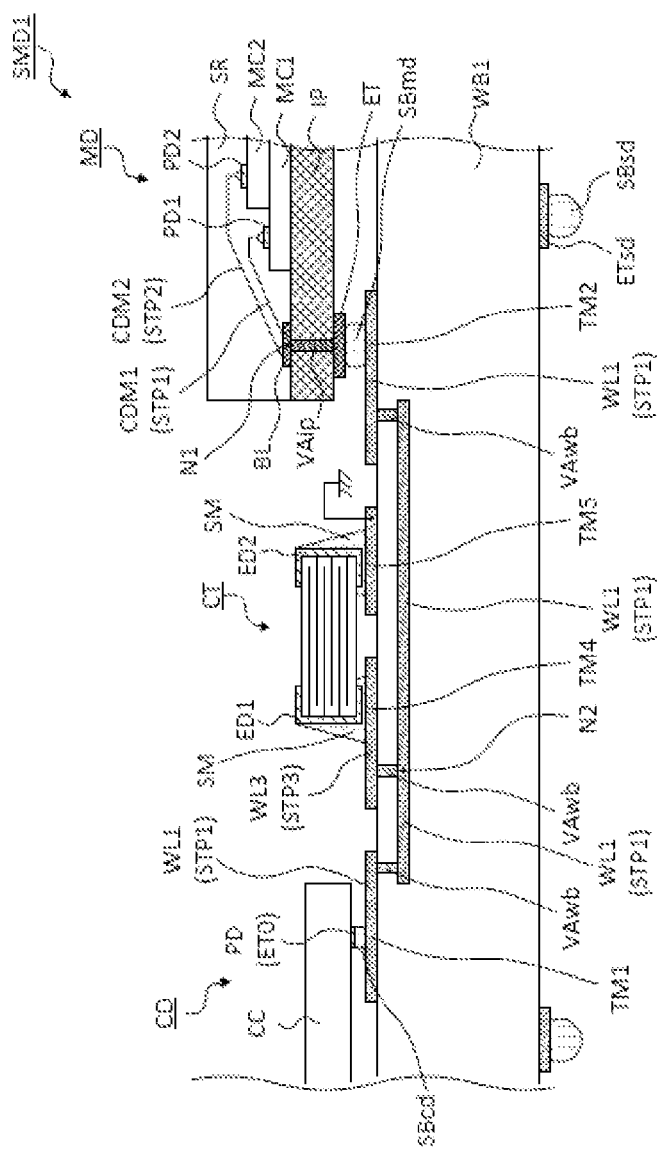
FIG. 12 is a diagram (partial enlarged cross-sectional view) schematically illustrating a longitudinal sectional structure of said semiconductor device along an A-A cross-sectional line of FIG. 11.

As shown in FIGS. 11 to 12, the semiconductor device SMD1 includes a wiring substrate WB1, a memory device MD mounted on the wiring substrate WB1, a control chip CC mounted on the wiring substrate WB1, and a capacitance CT mounted on the wiring substrate WB1. Incidentally, the capacitance CT in the present embodiment 1 is a capacitor element. Specifically, a chip condenser (also referred to as a "chip capacitor"). In the present embodiment 1, this capacitance element will be described using the same reference numerals as the "capacitance CT" described in the above basic idea (i.e., it will be referred to as "capacitor element CT"). As shown in FIGS. 11 to 12, the capacitor element CT is disposed between the control chip CC and the memory device MD.

<Wiring Substrate WB1>

Next, the configuration of the wiring substrate WB1. As shown in FIGS. 11 to 12, the wiring substrate WB1 has a plurality of wirings WL1, WL3 that is transmission paths for a signal. The wiring WL1 includes a terminal TM1 electrically connected to the electrode pad PD of the control chip CC, and a terminal TM2 electrically connected to the external connection terminal ET of the memory device MD. Incidentally, as shown in FIG. 10, the wiring WL1 is a part of the signal transmission path STP1 through which a signal transmission between the control chip CC and the memory chip MC1, MC2 is performed. On the other hand, as shown in each of FIGS. 10 and 12, the wiring WL3 is a signal transmission path STP3 branched from the signal transmission path STP1 at the branch point N2 of the signal transmission path STP1, which is located between the control chip CC and the branch point N1 of the signal transmission path STP1 (i.e., wiring WL1). Then, as shown in FIGS. 11 to 12, the wiring WL3 has a terminal TM4 to which one electrode ED1 of the capacitor element CT is to be electrically connected, and a terminal TM5 to which the other electrode ED2 of the capacitor element CT is to be electrically connected.

Further, in the present embodiment 1, the signal flowing through the wiring WL1 as the signal transmission path STP1 is, for example, a data signal, may be another signal such as a command-address signal. Further, as shown in FIG. 11, the wiring substrate WB1 also includes a wiring other than the above-described wiring WL1, WL3, but the explanation thereof is omitted.

<Memory Device Md>

Next, the configuration of the memory device MD will be described. As shown in FIGS. 11 to 12, the memory device MD includes an interposer IP, a memory chip IO1 mounted on the interposer IP and having an input/output circuit MC1, a memory chip IO2 mounted on the interposer IP and having an input/output circuit MC2, a conductive member CDM1 connected to the electrode pad PD1 of the memory chip MC1, a conductive member PD2 connected to the electrode pad MC2, and an external connection terminal ET electrically connected to the input/output circuit IO1, IO2.

Note that the interposer IP of the present embodiment 1 is a glass-epoxy-based resin substrate, which is the same as the above-mentioned wiring substrate WB1. Further, the memory chip MC1, MC2 of the present embodiment 1 are the same type of each other, for example, a LPDDR5-SDRAM (Low Power Double Data Rate 5-Synchronous Dynamic Random Access Memory that conforms to JEDEC standard). That is, in the present embodiment 1, the data signal described above is transmitted at a data rate of 5.0 Gbps or more. Further, the conductive members CDM1, CDM2 of the present embodiment 1 are bonding wires made of, for example, copper (Cu) or gold (Au). As shown in FIG. 12, each of the memory chips MC1, MC2 and each of the conductive members CDM1, CDM2 is sealed with a sealing material SR. The package structure of the memory device MD of the present embodiment 1 is a so-called wire bonding type BGA (Ball Grid Array) package structure.

As shown in FIGS. 10 and 12, the input/output circuit IO1 of the memory chip MC1 is electrically connected to the control chip CC via the electrode pads PD1 of the memory chip MC1, the conductive members CDM1, the external connection terminals ET of the memory devices MD, and the wiring WL1 of the wiring substrate WB1. As shown in FIGS. 10 and 12, the input/output circuit IO2 of the memory chip MC2 is electrically connected to the control chip CC via the electrode pads PD2 of the memory chip MC2, the conductive members CDM2, the external connecting terminals ET of the memory devices MD, and the wiring WL1 of the wiring substrate WB1.

Incidentally, the conductive member CDM1, as shown in FIG. 10, is a part of the signal transmission path STP1 in which a signal is transmitted between the control chip CC and one of the memory chip MC1. On the other hand, as shown in FIG. 10, the conductive member CDM2 is a signal transmission path STP2 through which a signal transmission between the control chip CC and the other memory chip MC2 is performed. As shown in FIG. 12, the conductive members CDM1, CDM2 are connected to bonding leads BL formed on upper surface of the interposer IP. That is, the bonding lead BL corresponds to the branch point N1 shown in FIG. 10. Incidentally, the bonding lead BL, as shown in FIG. 12, via the via VAip formed in the interposer IP, is electrically connected to the external connection terminal ET.

In the present embodiment 1, the lengths of the two conductive members CDM1, CDM2 are substantially the same. In other words, the distance from the external connection terminal ET of the memory device MD to the electrode pad PD1 of one memory chip MC1 and the distance from the external connection terminal ET of the memory device MD to the electrode pad PD2 of the other memory chip MC2 are substantially the same. That is, the interconnection topology of the memory devices MD of the present embodiment 1 is the "T-branch topology" described above.

Further, as shown in FIG. 10, the memory chip MC1 has a termination resistor TR1 (i.e., "on-die termination") connected to the end of the signal transmission path STP1, in addition to the input/output circuit IO1 connected on the wiring WL1 of the wiring substrate WB1 and the signal transmission path STP1 including the conductive member CDM1 of the memory device MD. Similarly, as shown in FIG. 10, the memory chip MC2 has a termination resistor TR2 (i.e., "on-die termination") connected to the end of the signal transmission path STP2, in addition to the input/output circuits IO2 connected on the signal transmission path STP2 including the conductive member CDM2 of the memory device MD. Incidentally, the respective termination resistor TR1, TR2, the fixed potential is connected to the reference potential is 0 V (i.e., "R=∞"). Thus, the reflection of the signal transmitted from the control circuit SCC of the control chip CC toward the input/output circuit IO1, IO2 of each memory chip MC1, MC2 can be reduced, and as a result, the disturbance of the eye pattern can be suppressed.

As examples of the use of the respective termination resistors TR1, TR2, when accessing the first memory chip MC1, as described above, the termination resistor TR1 of the memory chip MC1 to be accessed is turned on, and the termination resistor TR2 of the memory chip MC2 not to be accessed is turned off.

<Control Chip CC>

Next, the configuration of the control chip CC will be described. The control chip CC of the present embodiment 1 has a control circuit SCC and an electrode pad PD electrically connected to the control circuit SCC, as shown in FIGS. 10-12. Incidentally, the control circuit SCC is formed on the main surface of semiconductor substrate made of, for example, silicon. Further, the electrode pad PD, of the multilayer wiring layer formed on the main surface of semiconductor substrate, made of a part of the wiring located in the uppermost layer. The parasitic capacitance PCT0 shown in FIG. 10 is a capacitance parasitic on the electrode pad PD, for example. In the present embodiment 1, the above-mentioned two memory chips MC1, MC2 are controlled by one control chip CC.

The configuration of the memory chips MC1, MC2 is basically the same as that of the control chip CC. That is, the input/output circuits IO1, IO2 are formed on the main surface of a semiconductor substrate made of, for example, silicon. Further, each electrode pad PD1, PD2, of the multilayer wiring layer formed on the main surface of semiconductor substrate, consisting of a portion of the wiring located in the uppermost layer. Further, each parasitic capacitance PCT1, PCT2 shown in FIG. 10 is, for example, a capacitance parasitizing each electrode pad PD1, PD2.

<Capacitor Element CT>

Next, the configuration of the capacitance CT. The capacitor element CT of the present embodiment 1 is a "chip capacitor" as described above, specifically, as shown in FIGS. 11 to 12, consisting of two electrode ED1, ED2 via a dielectric (insulator). Then, as shown in FIGS. 10 to 12, one electrode ED1 of the capacitance CT is electrically connected to the wiring WL1 of the wiring substrate WB1. More specifically, one of the electrodes ED1 of the capacitance device CT is connected to a path (here, "signal-transmission path STP1") located between the terminal TM1 of the wiring WL1 and the terminal TM2 of the wiring WL1 in the wiring WL1 of the wiring substrate WB1.

The capacitance of the capacitor device CT of the present embodiment 1 is larger than each of the parasitic capacitance PCT0 parasitic on the control chip CC (see FIG. 10), the parasitic capacitance PCT1 parasitic on the first memory chip MC1 (see FIG. 10), and the parasitic capacitance PCT2 parasitic on the second memory chip MC2 (see FIG. 10). Specifically, each parasitic capacitance PCT0, PCT1, PCT2 parasitic on each chip is, for example, 0.8 pF. On the other hand, the capacitance of the capacitance device CT is larger than 1.0 times one of the respective parasitic capacitances PCT0, PCT1, PCT2 parasitic on the respective chips, and less than 2.0 times one of the respective parasitic capacitances PCT0, PCT1, PCT2 parasitic on the respective chips. Specifically, the capacitance of the capacitance device CT in the present embodiment 1 is, for example, 1.6 pF. The external dimension of the capacitor element CT in plan view is, for example, "width×length=0.2 mm×0.4 mm".

<Effect of Semiconductor Device SMD1 of Embodiment 1>

Next, the effect of the semiconductor device SMD1 of the present embodiment 1 will be described. First, the semiconductor device SMD1 of the present embodiment 1 is a "branch case" in which two memory chips MC1, MC2 are controlled by one control chip CC. In the semiconductor device SMD1 composed of the branch case, as in the basic idea described above, a capacitance CT larger than the parasitic capacitance PCT0, PCT1, PCT2 of the control chip CC and the branch point N1 of the signal transmission path STP1 is provided between the control chip CC and the branch point N1 of the signal transmission path STP1. As a result, the charge exchange shown in FIGS. 8 to 9 can be realized between the newly installed capacitance (capacitor element) CT and the parasitic capacitance parasitic on the memory chip which is not accessed. Consequently, it is possible to suppress the disturbance of the eye pattern, even if the transmission path of the signal becomes faster, it is possible to transmit a signal between the control chip CC and the memory chip MC1, MC2.

Modified Example of Embodiment 1

Next, a description will be given of a modification of the embodiment 1 described above.

Modified Example 1 of Embodiment 1

First, in the above embodiment 1, as examples of the use of the respective termination resistors TR1, TR2, when the first memory chip MC1 is accessed, the termination resistor TR1 of the memory chip MC1 to be accessed is turned on, and the termination resistor TR2 of the memory chip MC1 not to be accessed is turned off. However, in the semiconductor device employing the T-branch topology, when the total length of the signal transmission paths (strictly speaking, the signal transmission paths from the branch point N1 to the respective input/output circuit IO1, IO2) from the branch point N1 to the respective memory chip MC1, MCR2 is long (for example, when the total length is 13.0 mm or more), as shown in FIG. 13, the respective termination resistor TR1, TR2 may be used. That is, the terminal end resistance of the memory chip to be accessed is turned off, and the terminating resistance of the memory chip not to be accessed is turned on.

As a result, disturbance of the eye pattern can be further improved.

(MODIFIED EXAMPLE 2 OF EMBODIMENT 1) In addition, the routing topology of the memory device MD of the present embodiment 1 has been described as "T branch topology", but the above-described "fly-by topology" may be used. That is, the lengths of the two conductive members CDM1, CDM2 may be different from each other. For example, when the distance from the external connection terminal ET of the memory device MD to the electrode pad PD2 of the other memory chip MC2 (strictly speaking, the distance from the branch point N1 to the electrode pad PD2) is longer than the distance from the external connection terminal ET of the memory device MD to the electrode pad PD1 of the one memory chip MC1 (strictly speaking, the distance from the branch point N1 to the electrode pad PD1), disturbance of the eye pattern can be further improved by making the resistance value of the terminal resistance TR2 of the other memory chip MC2 (i.e., the resistance value of the one of which the length of the branch line is longer) larger than the resistance value of the terminal resistance of the one memory chip MC1 (i.e., the resistance value of the one of which the length of the branch line is shorter).

Embodiment 2

<Configuration of Semiconductor Device SMD2 of Embodiment 2>

Next, the semiconductor device SMD2 according to the present embodiment 2 will be described with reference to FIGS. 14 to 16. The main difference from the above embodiment 1 is that the two memory chips MC1, MC2 are configured as a single memory device MD. However, in the present embodiment 2, the two memory chips MC1, MC2 are configured as separate memory device MD1, MD2. Note that descriptions of the same content (configuration, member, etc.) as the above-mentioned basic idea and the content (configuration, member, etc.) described in each of the above-mentioned embodiment 1 are omitted.

Figure 14:
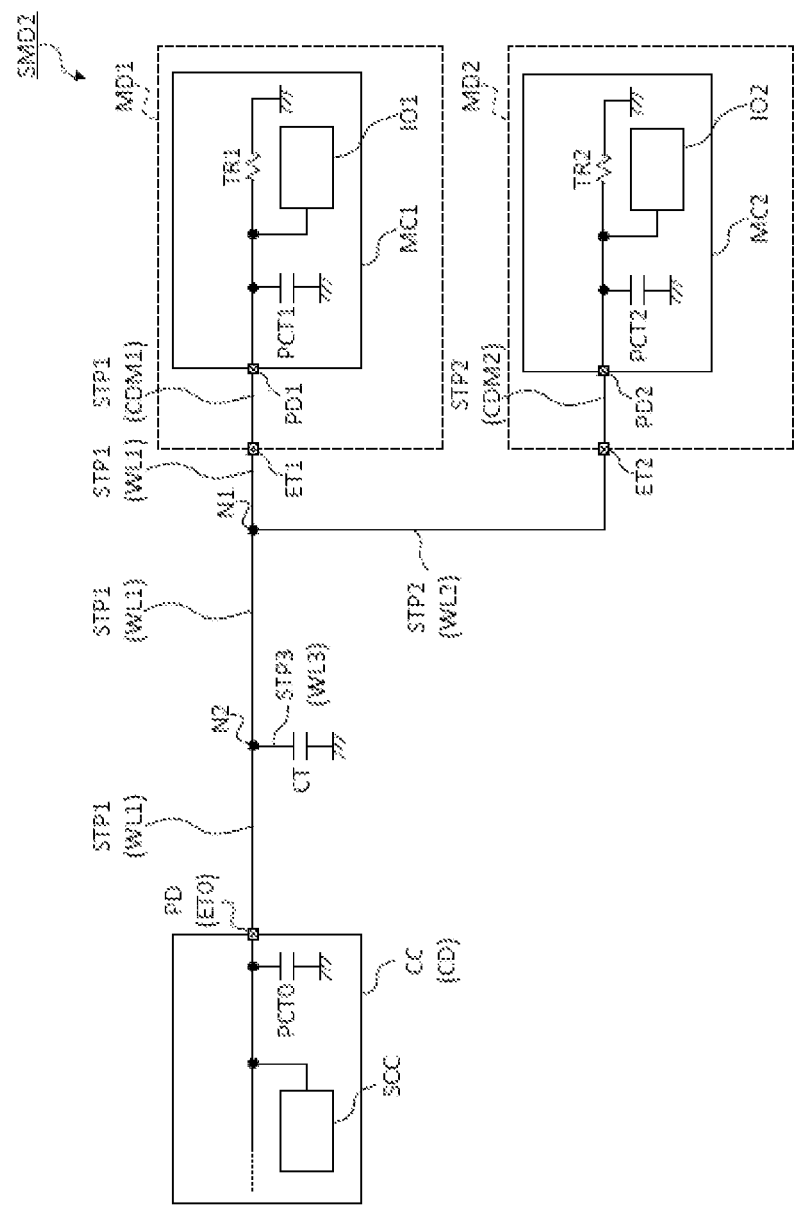
FIG. 14 is a diagram (circuit diagram) illustrating a configuration of a semiconductor device according to EMBODIMENT 2.

More specifically, as illustrated in FIG. 14, one of the two memory chip MC1, MC2 (here, the memory chip MC1) is configured as a memory device MD1. Further, as shown in FIG. 14, the other of the two memory chips MC1, MC2 (here, the memory chip MC2) is configured as a memory device MD2. As shown in FIG. 14, the external connection terminal ET1 connected to the electrode pad PD1 of the memory chip MC1 differs from the external connection terminal ET2 connected to the electrode pad PD2 of the memory chip MC2. That is, as shown in FIGS. 14 to 16, the branch point N1 is provided outside the respective memory devices MD1, MD2. In other words, the branch point N1 is on the wiring WL1 of the wiring substrate WB2 as shown in FIGS. 14 to 16.

Next, the respective members composing the semiconductor device SMD2 will be described in detail with reference to FIGS. 14 to 16.

Figure 15:
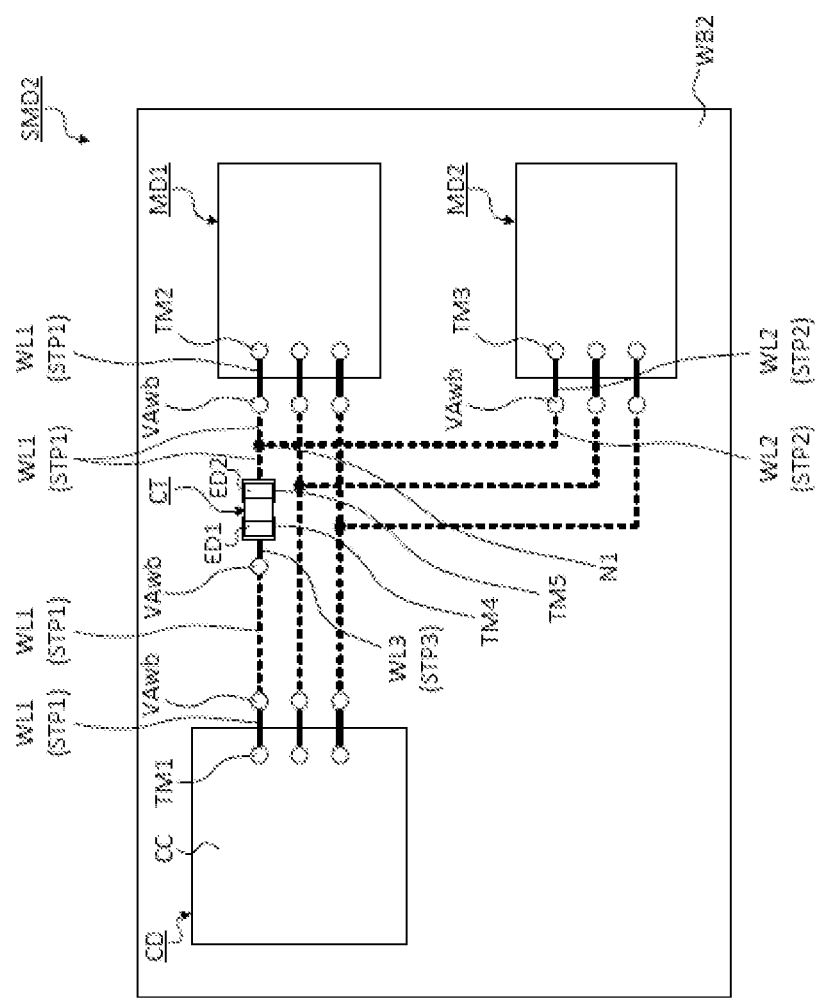
FIG. 15 is a diagram (plan view) schematically illustrating a planar layout of each electronic component composing said semiconductor device according to EMBODIMENT 2.
Figure 16:
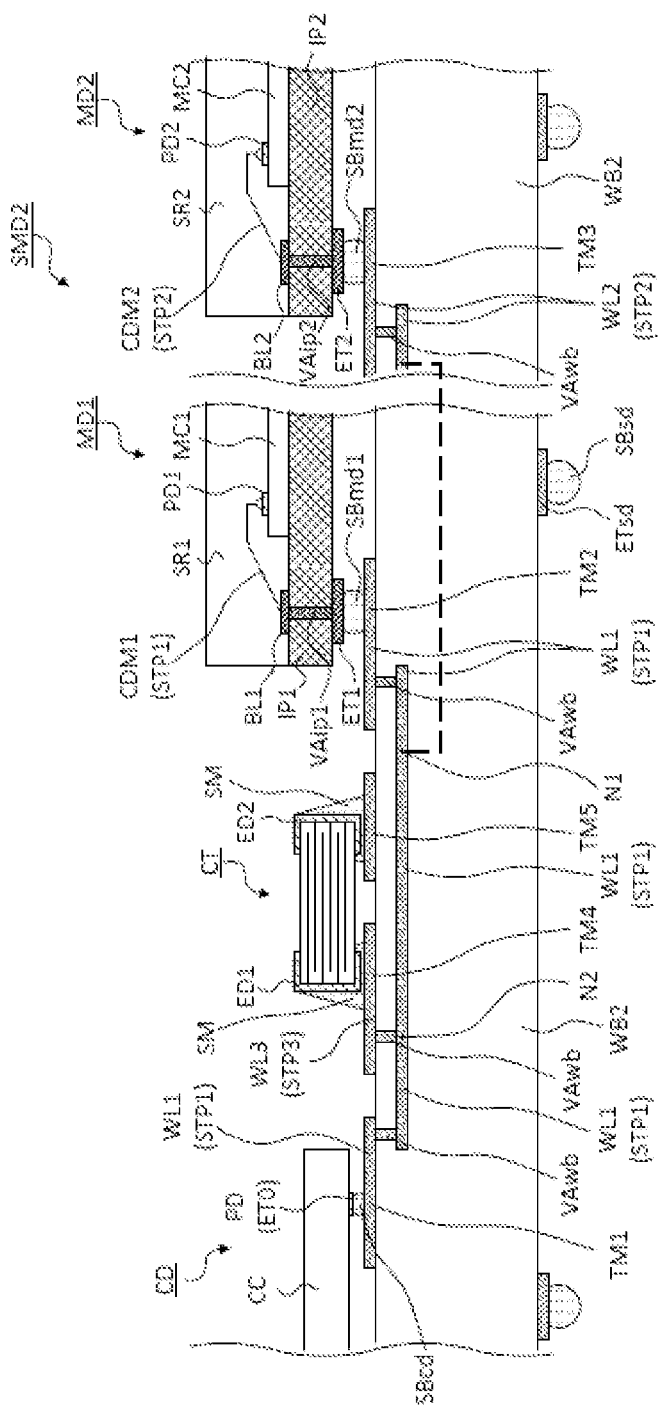
FIG. 16 is a diagram (partial enlarged cross-sectional view) schematically illustrating a longitudinal sectional structure of said semiconductor device shown in FIG. 15.

As shown in FIGS. 15 to 16, the semiconductor device SMD2 includes a wiring substrate WB2, a memory device MD1, a memory device MD2, a control chip CC, and a capacitance CT mounted on the wiring substrate WB2.

<Wiring Substrate WB2>

Next, the configuration of the wiring substrate WB2. The wiring substrate WB2 has a plurality of wiring WL1, WL2, WL3 that are transmission paths of signals, as shown in FIGS. 15 to 16. Wiring WL1 includes a terminal TM1 electrically connected to the electrode pad PD of the control chip CC, the external connection terminal ET1 of the memory device MD1 and electrically connected terminal TM2, and an external connection terminal ET2 of the memory device MD2 and electrically connected terminal TM3, and a. Incidentally, the wiring WL1, as shown in FIG. 14, is a part of the signal transmission path STP1 signal is transmitted between the control chip CC and the memory chip MC1. Further, the wiring WL2, as shown in FIG. 14, the signal transmission path STP1 (i.e., wiring WL1) branches from the signal transmission path STP1 at the branch point N1 of the signal transmission path STP2. Signal transmission between the control chip CC and the memory chip MC2 is performed via the signal transmission path STP2. Furthermore, the wiring WL3, as shown in each of FIGS. 14 and 16, the control chip CC and the signal transmission path STP1 (i.e., wiring WL1) is a signal transmission path STP3 branched from the signal transmission path STP1 at the branch point N2 of the signal transmission path STP1 located between the branch point N1. Then, the wiring WL3, as shown in FIGS. 15 to 16, and a terminal TM4 to which one electrode ED1 of the capacitor element CT is connected, the other electrode ED2 of the capacitor element CT and a terminal TM5 to be connected.

<Each Memory Device MD1, MD2>

Next, the configuration of each memory device MD1, MD2 will be described. Since the two memory devices MD1, MD2 have the same configuration with each other, one memory device (here, memory device MD1) will be described the configuration of each memory device MD1, MD2. As shown in FIGS. 15 to 16, the memory device MD1 (MD2) includes an interposer IP1 (IP2), a memory chip MC1 (MC2 mounted on the interposer IP1 and having an input/output circuit IO1 (IO2), a conductive member CDM1 (CDM2 connected to the electrode pads PD1 (PD2) of the memory chip MC1, and an external connecting terminal ET1 (ET2 electrically connected to the input/output circuit IO1).

Then, as shown in each of FIGS. 14 and 16, the I/O circuit IO1 of the memory chip MC1 is electrically connected to the control chip CC through the electrode pad PD1 of the memory chip MC1, the conductive member CDM1, the external connection terminal ET of the memory device MD1, and the wiring WL1 of the wiring substrate WB. Further, as shown in each of FIGS. 14 and 16, the input-output circuit IO2 of the memory chip MC2, the electrode pad PD2 of the memory chip MC2, the conductive member CDM2, the external connection terminal ET2 of the memory device MD2, the wiring substrate WB a part of the wiring WL1, the terminal TM1 of the wiring WL1 and the wiring WL2 branched from the wiring WL1 at the branch point N1 of the wiring WL1 located between the terminal TM2 of the wiring TM2 via, it is electrically connected to the control chip CC.

In the present embodiment 2, the lengths of the two conductive members CDM1, CDM2 differ from each other. In this embodiment 2, the distance (strictly speaking, the distance from the branch point N1 to the electrode pad PD2) from the external connection terminal ET2 of the memory device MD2 to the electrode pad PD2 of the memory chip MC2 is longer than the distance (strictly speaking, the distance from the branch point N1 to the electrode pad PD1) from the external connection terminal ET1 of the memory device MD1 to the electrode pad PD1 of the memory chip MC1. That is, the interconnection topology of the memory chip MC1, MC2 of the present embodiment 2 is the "fly-by topology" described above.

Further, as in the above embodiment 1, as shown in FIG. 14, each memory chip MC1, MC2 has a termination resistor TR1, TR2 (i.e., "on-die termination") connected to the end of each signal transmission path STP1, STP2, but the use of each termination resistor TR1, TR2 differs from the above embodiment 1. Specifically, as described above, the present embodiment 2 employs the "fly-by topology" as the interconnect topology of the memory chip MC1, MC2. Therefore, as shown in FIG. 17, the resistance value of the termination resistor (here, "termination resistor TR2") having the longer length of the branch wiring is larger than the resistance value of the termination resistor (here, "termination resistor TR1") having the shorter length of the branch wiring. In other words, the termination resistor TR1 of the short memory chip MC1 of the branch wiring is turned off, while the termination resistor TR2 of the memory chip MC2 having a long length of the branch wiring is turned on. This makes it possible to improve the disturbance of the eye pattern.

<Capacitor Element CT>

Next, the configuration of the capacitance CT. The capacitor element CT of the present embodiment 2, like the above embodiment 1, is a "chip capacitor", specifically, as shown in FIGS. 15 to 16, consisting of two electrode ED1, ED2 via a dielectric (insulator). Then, as shown in FIGS. 114 to 16, one electrode ED1 of the capacitor element CT is electrically connected to the wiring WL1 of the wiring substrate WB. More specifically, one electrode ED1 of the capacitor element CT is coupled to a path (here, "signal transmission path STP1") of the wiring WL1 of the wiring substrate WB, which is located among the terminal TN1, the terminal TM2 and the terminal TM3.

<Effect of Semiconductor Device SMD2 of Embodiment 2>

Next, the effect of the semiconductor device SMD2 of the present embodiment 2 will be described. First, the semiconductor device SMD2 of the present embodiment 2 is a "branch case" in which two memory chips MC1, MC2 are controlled by one control chip CC, similarly to the above embodiment 1. In the semiconductor device SMD2 composed of the branch case, as in the basic idea described above, a capacitance CT larger than the parasitic capacitance PCT0, PCT1, PCT2 of the control chip CC and the branch point N1 of the signal transmission path STP1 is provided between the control chip CC and the branch point N1 of the signal transmission path. As a result, the charge exchange shown in FIGS. 8 to 9 can be realized between the newly installed capacitance (capacitor element) CT and the parasitic capacitance parasitic on the memory chip which is not accessed. Consequently, it is possible to suppress the disturbance of the eye pattern, even if the transmission path of the signal becomes faster, it is possible to transmit a signal between the control chip CC and the memory chip MC1, MC2.

Modified Example of Embodiment 2

Next, a modification of the embodiment 2 will be described.

Modified Example 1 of Embodiment 2

First, the routing topology of the memory device MD of the present embodiment 2 has been described as "fly-by topology", but the above-described "T branch topology" may be used. When the T-branch topology is adopted as the interconnect topology of the memory device MD, the termination resistors TR1, TR2 may be further used as shown in FIG. 13 ("modified example of embodiment 1"). As a result, the disturbance of the eye pattern can be further improved.

The invention made by the present inventor has been described above in detail based on the embodiment, but the present invention is not limited to the embodiment described above, and it is needless to say that various modifications can be made without departing from the gist thereof. As a concrete example, a modified example common to the above-mentioned embodiments 1 and 2 will be described below.

Modified Example 1

First, in the above-mentioned embodiments 1 and 2, the above-mentioned new capacitance (capacitor element) CT is installed on the control chip CC side with respect to the branch point N1 of the above-mentioned signal transmission path STP1 (line WL1), but a new capacitance (capacitor element) CT may be installed on the memory chip MC1, MC2 side with respect to the branch point N1. However, as shown in FIG. 12 and FIG. 16, when the memory chips MC1, MC2 are configured as a package ("BGA" here), the capacitor element CT need to be mounted in the package in the process of manufacturing the package. Therefore, after the package is manufactured, it is difficult to change the capacitance element mounted in the package to a capacitance element having another capacitance. Therefore, from the viewpoint of improving the combination flexibility of the memory chip MC1, MC2 and the capacitor element CT, it is preferable that the capacitor element CT is not mixed in the packages on which the memory chip is mounted, as in the above-mentioned embodiment 1.

In the above embodiments 1 and 2, the capacitance CT may be used as a termination resistor of the control chip CC. In this case, the signal transmission path (in the above embodiment 1, 2, the signal transmission path STP3) to which capacitive CT is coupled also becomes a part constituting the termination resistor. Therefore, when the capacitance CT is provided on the memory chip MC1, MC2 side of the branch point N1 of the signal transmission path STP1, the signal transmission path from the branch point N1 to the capacitance CT must also be considered. Further, the fact that the capacitance CT is mixed in the package in which the memory chip is mounted means that the load on the control chip CC increases. Therefore, when using the newly installed capacitance CT as a termination resistor of the control chip CC, as described above embodiment 1, 2, it is preferable to install the control chip CC side than the branch point N1 of the signal transmission path STP1 (wiring WL1).

Modified Example 2

Further, in the above embodiment 1, 2 has been described that the memory device MD is composed of a BGA of the wire bonding type, a so-called flip-chip type BGA that does not use a bonding wire as a conductive member, or a package using a lead frame as an interposer it may be. Incidentally, if the configuration without using a bonding wire as a conductive member (e.g., BGA of the flip-chip), as compared with the BGA of the wire bonding type, the distance from the external connection terminal ET of the memory device MD to the respective electrode pad PD1, PD2 of the memory chip MC1, MC2 is short. That is, the BGA of the flip-chip large portion, since it is possible to shorten the length of each branch wiring than the BGA of the wire bonding type, as compared with the BGA of the wire bonding type, easily improve the disturbance of the eye pattern.

Modified Example 3

In the above embodiments 1 and 2, the control chip CC has been described as having a configuration not covered with the sealing member SR as in each memory chip MC1, MC2 (so-called bare chip form), but the control chip CC may also have a packaged structure as in each memory chip MC1, MC2. On the other hand, in the above embodiments 1 and 2, since the control chip CC is used as a bare chip, the control chip CC and the electrode pads PD of the control chip CC can be seen from the control device CD and the external connection terminals ET0 of the control device CD, respectively.

Modified Example 4

In addition, in the above-mentioned embodiments 1 and 2, it is explained that each of the control chip CC and the memory chip MC1, MC2 is the semiconductor device SMD1 and SMD2 mounted on the wired substrate WBs. However, each of the chips CC and MC1, MC2 (or each of the devices CDs and MDs) may be configured as an electronic device directly mounted on a motherboard (not shown) without using the above-mentioned interconnection substrate WBs.

Modified Example 5

Figure 18:
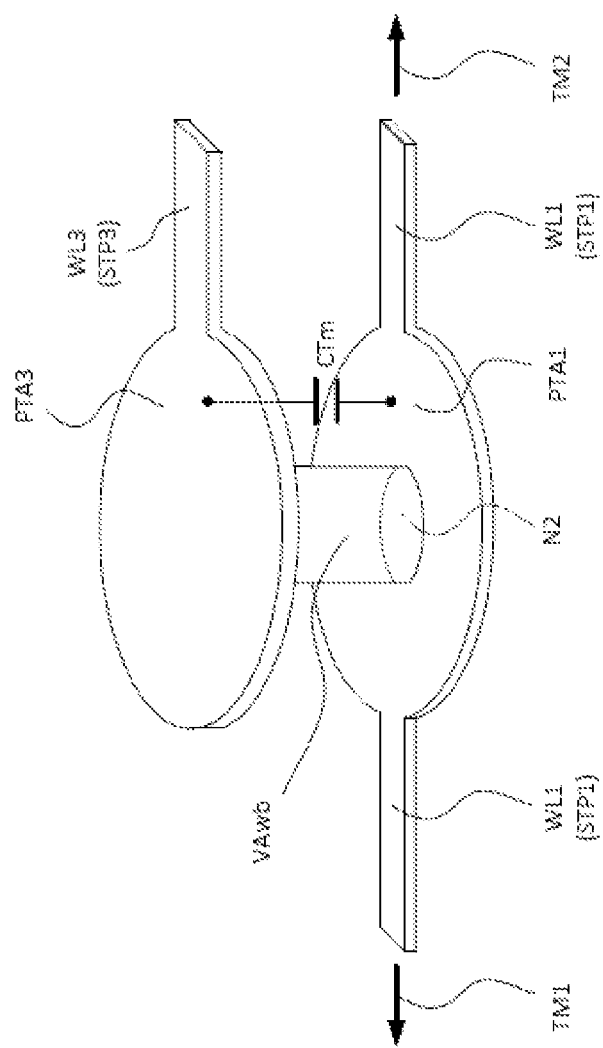
FIG. 18 is a diagram illustrating MODIFIED EXAMPLE of said capacitor element of each of EMBODIMENT 1 and EMBODIMENT 2.

In the above embodiments 1 and 2, the use of a chip capacitor as the capacitance CT has been described. However, for example, as shown in FIG. 18, a pattern PTA1 consisting of a part of the wiring WL1, the wiring layer in which the wiring WL1 is formed, another wiring layer adjacent via an insulating layer (not shown) (here, one wiring layer) using a pattern PTA3 consisting of a part of the formed wiring WL3, it may constitute a capacitance CTm.

However, according to studies conducted by the present inventor, in order to obtain a capacity of 0.8 pF, it is necessary to set the external dimension of each pattern PTA1, PTA3 described above to be about 590 μmΦ, and in order to obtain a capacity of 1.45 pF, it is necessary to set the external dimension of each pattern PTA1, PTA3 described above to be about 870 μmΦ. Therefore, from the viewpoint of reducing the capacitance installation area, it is preferable to use a chip capacitor such as the above embodiments 1 and 2.

Modified Example 6

Furthermore, within the scope consistent with the gist described for each modified example described above, a portion or all of each modified example described above can be applied in combination with each other.

What is claimed is:

1. A semiconductor device comprising:
   a first memory chip;
   a second memory chip;
   a control chip controlling each of said first memory chip and said second memory chip; and
   a first signal transmission path through which a signal transmission between said control chip and each of said first memory chip and said second memory chip is performed,
   wherein a signal transmission between said control chip and said first memory chip is performed via said first signal transmission path,
   wherein a signal transmission between said control chip and said second memory chip is performed via a part of said first signal transmission path and a second signal transmission path branched from said first signal transmission path at a first branch point of said first signal transmission path, which is located between said control chip and said first memory chip, and
   wherein a capacitance that is larger than each of a parasitic capacitance parasitic on said control chip, a first parasitic capacitance parasitic on said first memory chip and a second parasitic capacitance parasitic on said second memory chip is coupled onto a third signal transmission path branched from said first signal transmission path at a second branch point of said first signal transmission path, which is located between said control chip and said first branch point of said first signal transmission path.

2. The semiconductor device according to claim 1, wherein said capacitance coupled onto said third signal transmission path is larger than 1.0 time said first parasitic capacitance, and less than or equal to 2.0 times said first parasitic capacitance.

3. The semiconductor device according to claim 2,
   wherein a connection form between said control chip and each of said first memory chip and said second memory chip is T-branch topology,
   wherein said first memory chip includes a first termination resistor coupled with each of a first input/output circuit coupled onto said first signal transmission path and an end of said first signal transmission path,
   wherein said second memory chip includes a second termination resistor coupled with each of a second input/output circuit coupled onto said second signal transmission path and an end of said second signal transmission path,
   wherein, in case of accessing said first memory chip, said control chip:

does activate said first input/output circuit of said first memory chip;
does deactivate said second input/output circuit of said second memory chip;
does increase a resistance value of said first termination resistor; and
does decrease a resistance value of said second termination resistor, and
wherein, in case of accessing said second memory chip, said control chip:
does deactivate said first input/output circuit of said first memory chip;
does activate said second input/output circuit of said second memory chip;
does decrease said resistance value of said first termination resistor; and
does increase said resistance value of said second termination resistor.

4. The semiconductor device according to claim 3, wherein each of said first memory chip and said second memory chip is LPDDR5-SDRAM (Low Power Double Data Rate 5-Synchronous Dynamic Random Access Memory).

5. The semiconductor device according to claim 2,
wherein a connection form between said control chip and each of said first memory chip and said second memory chip is Fly-by topology,
wherein said first memory chip includes a first input/output circuit and a first termination resistor,
wherein said second memory chip includes a second input/output circuit and a second termination resistor,
wherein a distance from said first branch point to said second input/output circuit is longer than a distance from said first branch point to said first input/output circuit, and
wherein a resistance value of said second termination resistor is larger than a resistance value of said first termination resistor.

6. The semiconductor device according to claim 5, wherein each of said first memory chip and said second memory chip is LPDDR5-SDRAM (Low Power Double Data Rate 5-Synchronous Dynamic Random Access Memory).

* * * * *